United States Patent [19]

Minagawa et al.

[11] Patent Number: 4,967,394
[45] Date of Patent: Oct. 30, 1990

[54] SEMICONDUCTOR MEMORY DEVICE HAVING A TEST CELL ARRAY

[75] Inventors: Hidenobu Minagawa, Kawasaki; Yuuichi Tatsumi, Tokyo; Hiroshi Iwahashi, Yokohama; Masamichi Asano, Tokyo; Mizuho Imai, Annaka, all of Japan

[73] Assignee: Kabushiki Kaisha Toshiba, Kawasaki, Japan

[21] Appl. No.: 241,748

[22] Filed: Sep. 8, 1988

[30] Foreign Application Priority Data

Sep. 9, 1987 [JP] Japan .................................. 62-225529
Dec. 3, 1987 [JP] Japan .................................. 62-306165

[51] Int. Cl.$^5$ ........................ G11C 7/00; G11C 29/00
[52] U.S. Cl. .................................... 365/201; 365/210; 365/104
[58] Field of Search ................... 365/210, 201, 189.01, 365/189.05, 104, 185; 371/10, 21

[56] References Cited

U.S. PATENT DOCUMENTS 4,423,492 12/1983 Yoshida .............................. 365/226
4,719,599 1/1988 Natsui et al. ....................... 365/201
4,819,212 4/1989 Nakai et al. ..................... 365/201 X Primary Examiner—Stuart N. Hecker
Assistant Examiner—Alyssa H. Bowler
Attorney, Agent, or Firm—Finnegan, Henderson, Farabow, Garrett and Dunner

[57] ABSTRACT

A semiconductor memory device in which data can be read out in response to an address signal comprises power source lines, a plurality of row and column conductive lines, a memory cell array including nonvolatile memory cells arranged in a matrix form of rows and columns and respectively connected to the plurality of row and column lines and the power source lines, a first selector circuit for generating a signal for selecting the row conductive lines in response to an address signal, a dummy row line, and a dummy memory cells each having a source, a drain and a control gate connected to the dummy row line. In the semiconductor memory device, one of paths between the source and the power source line and between the drain and the corresponding row line is closed and the other path is opened, and it further includes a second selector circuit for selectively generating a line selection signal for selecting one of the row conductive lines in response to an address signal and a dummy selection signal for selecting the dummy row line in response to the same address signal.

31 Claims, 14 Drawing Sheets

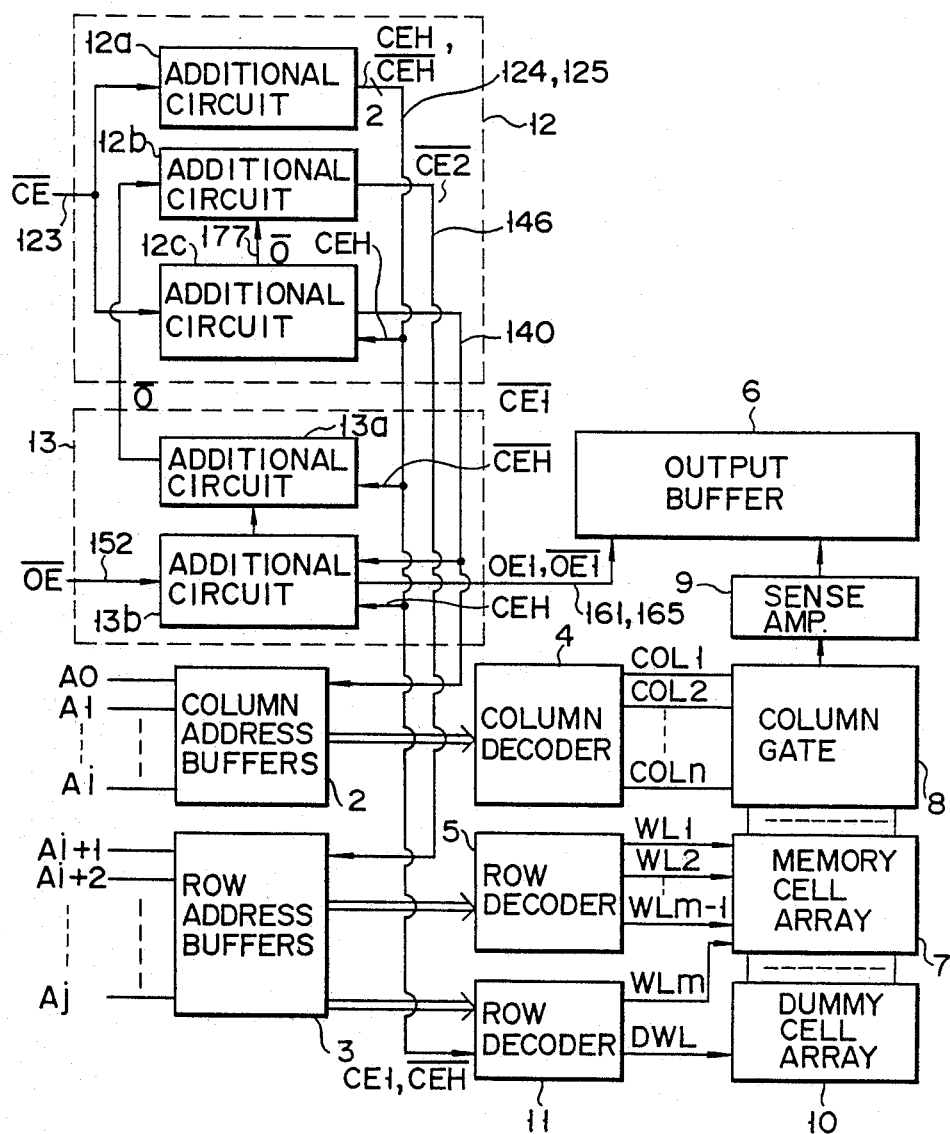
F I G. 3

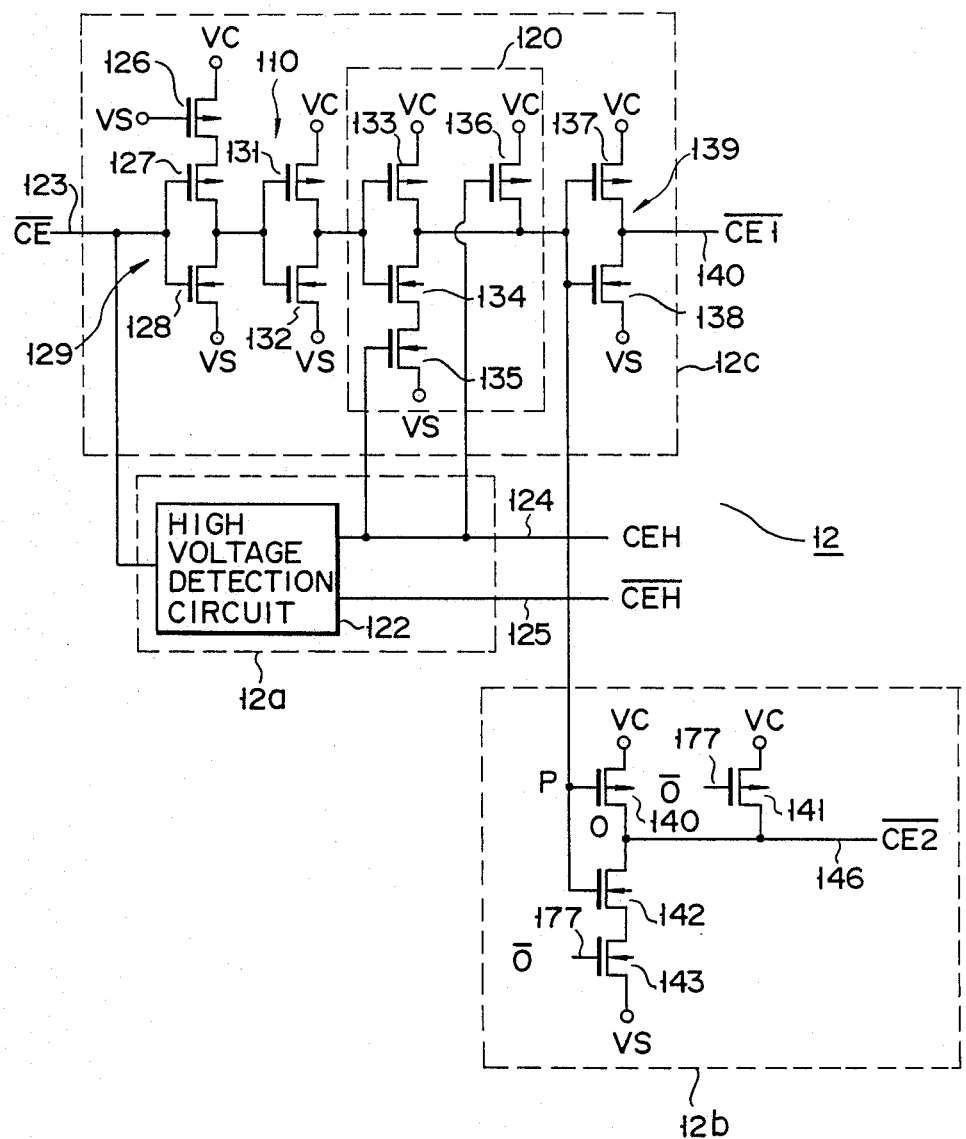
F I G. 4

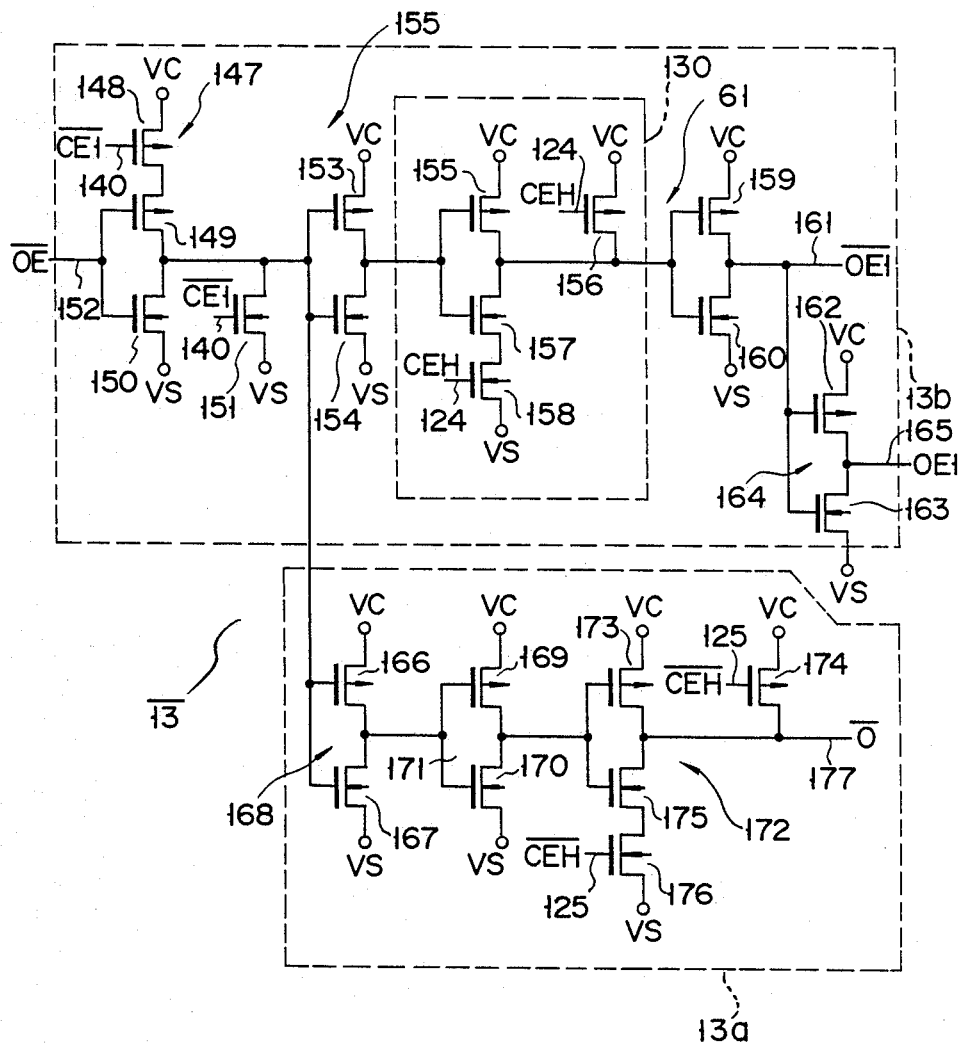
F I G. 5

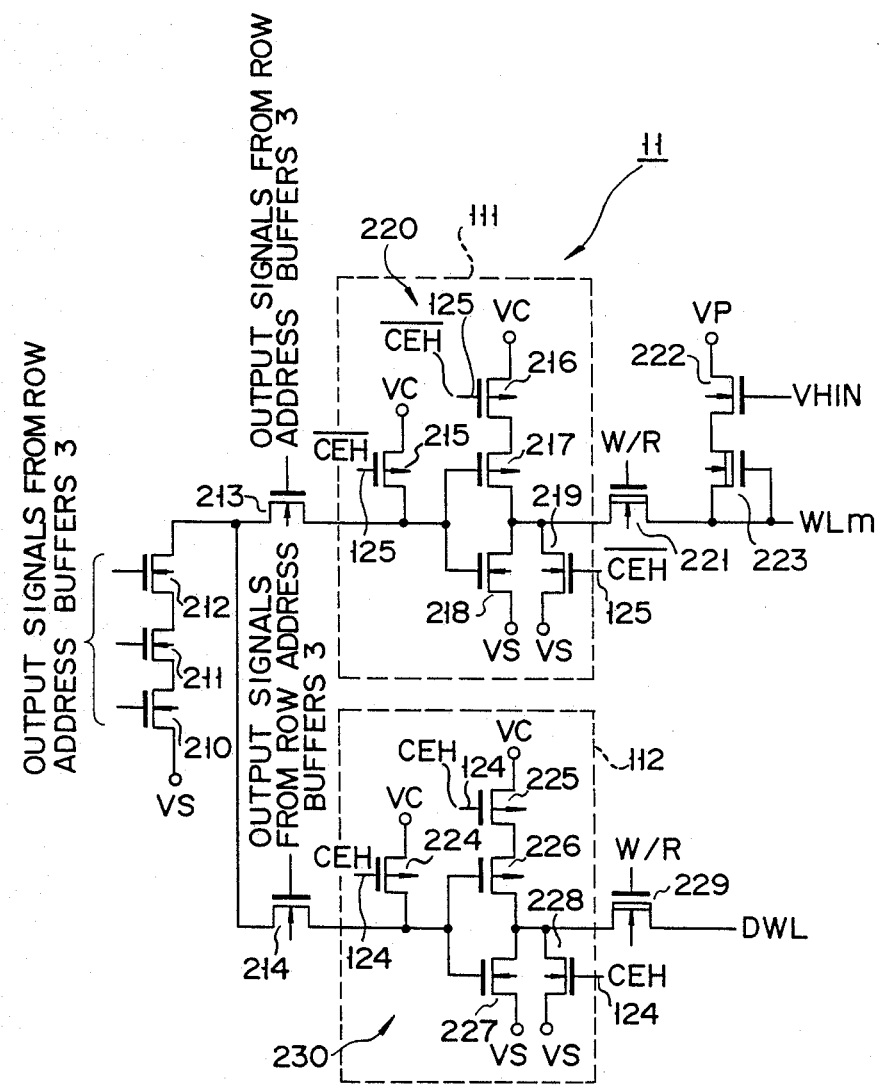
F I G. 7

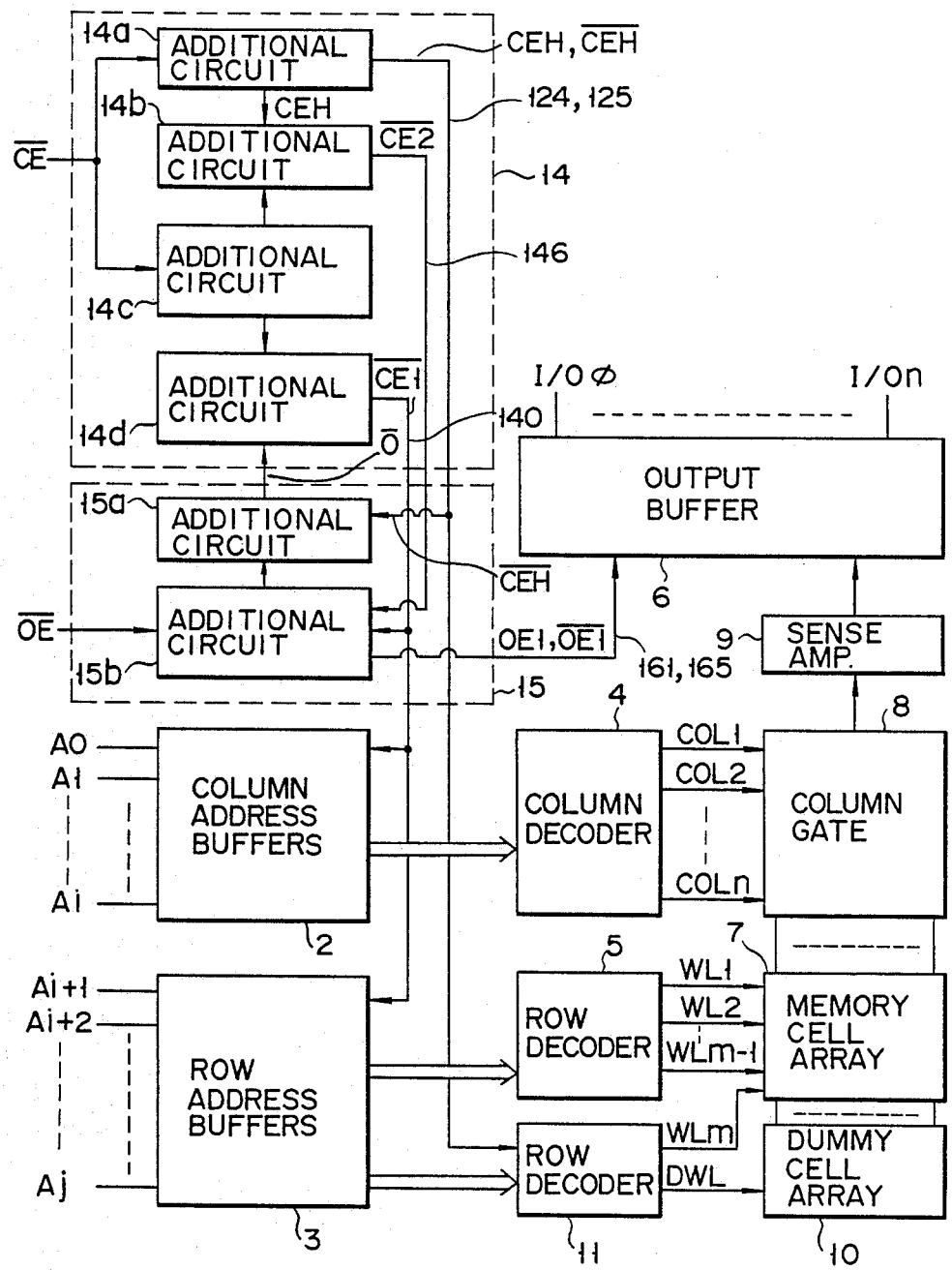
F I G. 9

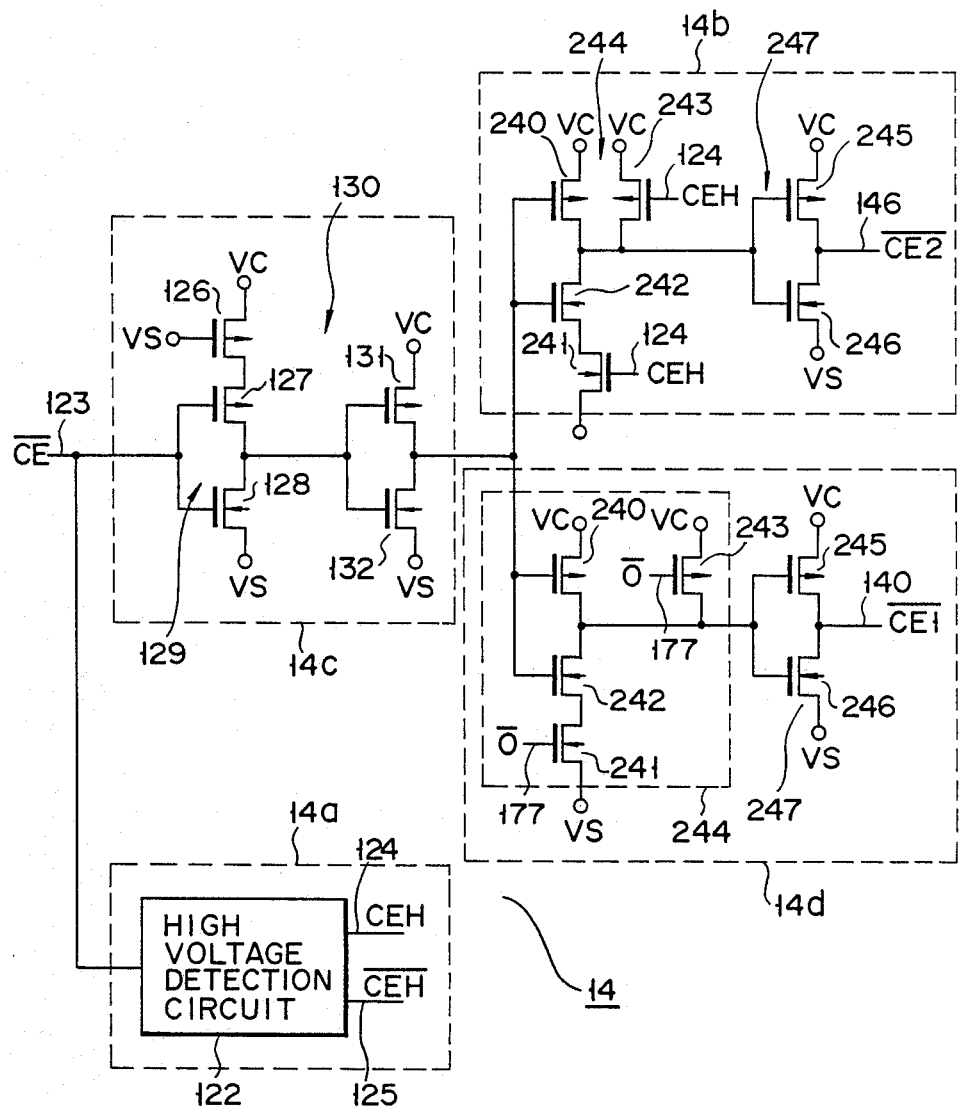
F I G. 10

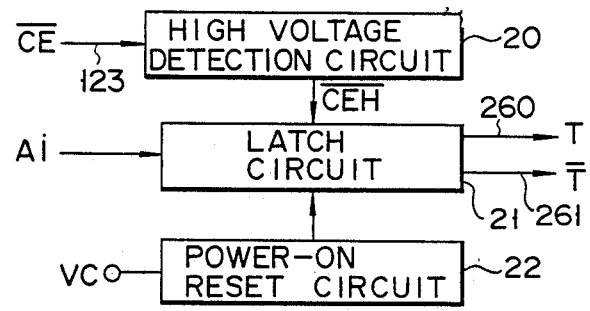
F I G. 12
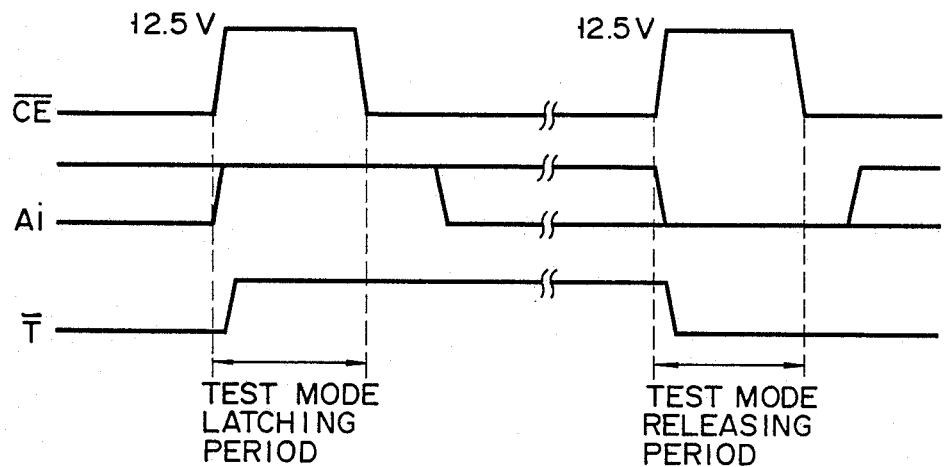
F I G. 13
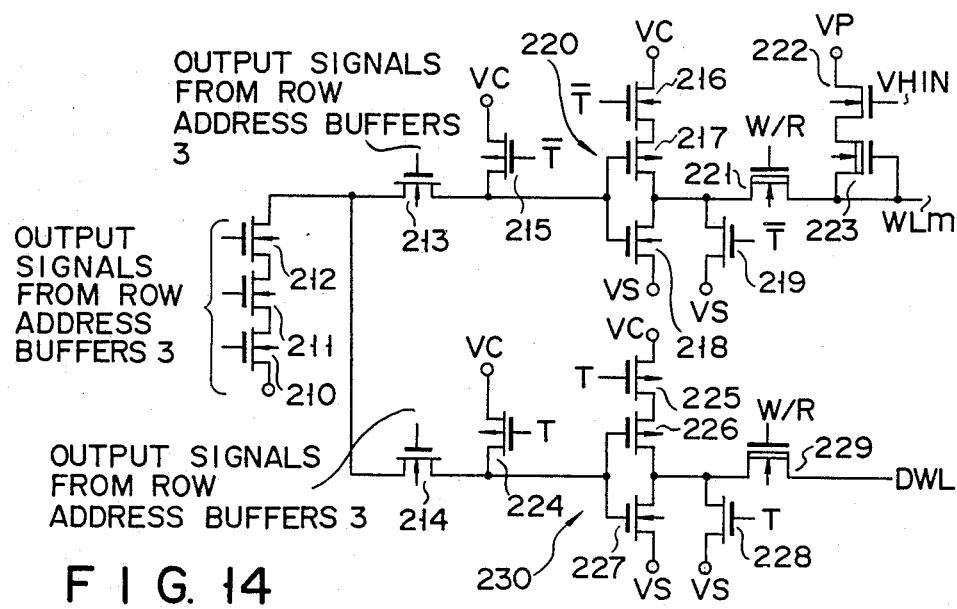
F I G. 14

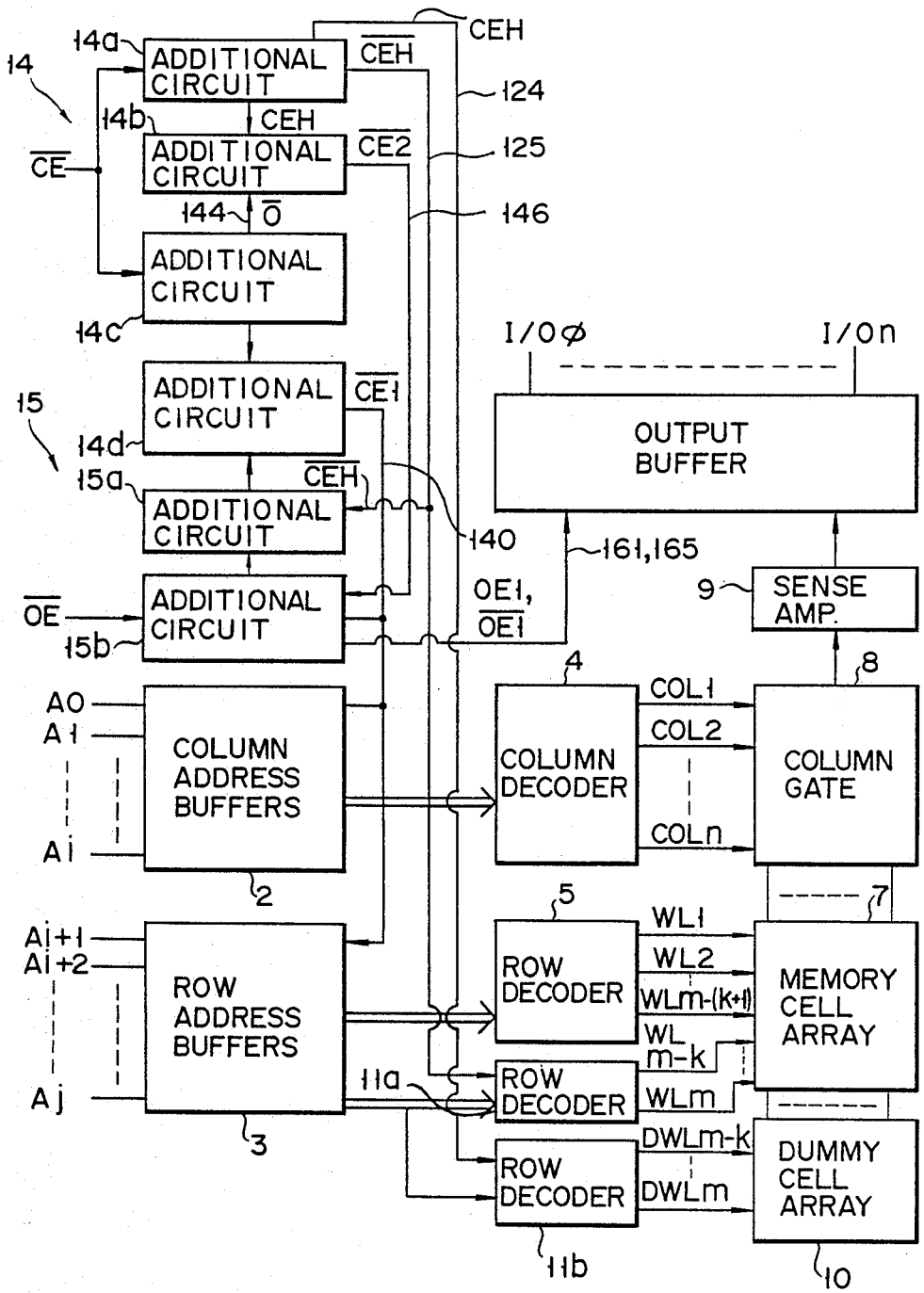
F I G. 15

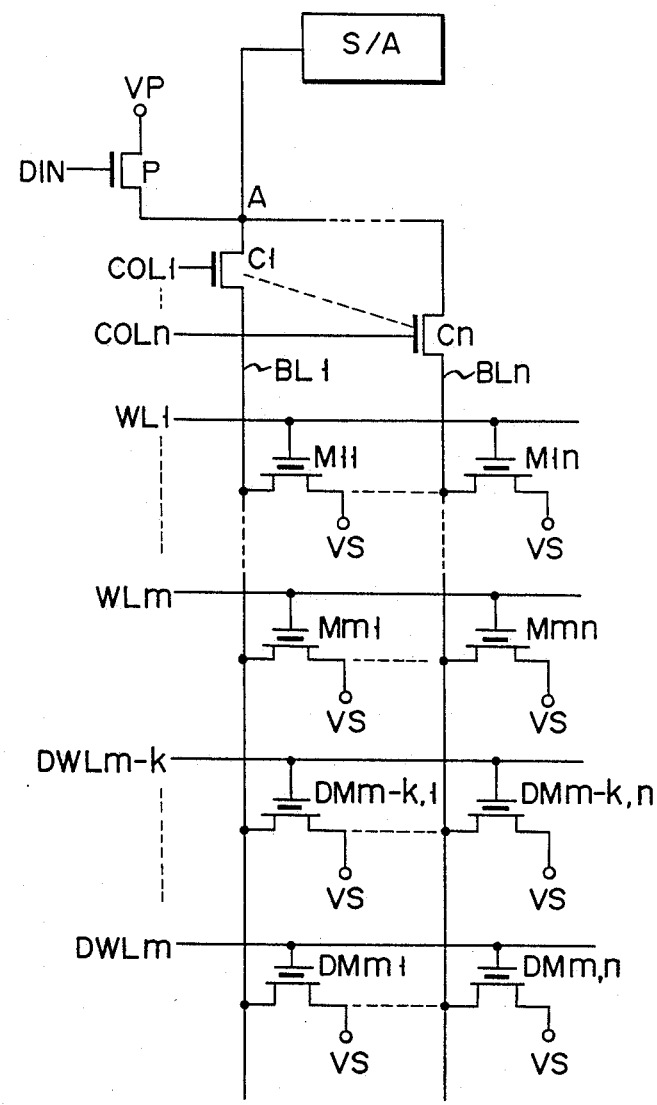
F I G. 16

SEMICONDUCTOR MEMORY DEVICE HAVING A TEST CELL ARRAY

BACKGROUND OF THE INVENTION

1. Field of the Invention

This invention relates to a semiconductor memory device having a memory cell array including nonvolatile semiconductor memory elements and a dummy cell array, and more particularly to a semiconductor memory device in which data programming can be permitted only once.

2. Description of the Related Art

A nonvolatile semiconductor memory device, particularly an EPROM whose memory cells are double gate nonvolatile MOS transistors with a floating gate and a control gate, allows data to be rewritten thereinto. Because of this feature, the EPROMs have been used in various types of computer systems. If electrons are stored on the floating gate of the double gate MOS transistor, the threshold voltage thereof is high. With such a high threshold voltage, the MOS transistor will not be conductive when a high level voltage, for example, +5 V is applied to the control gate. But when no electron is stored on the floating gate, the threshold voltage is maintained its initial low voltage. If the high level voltage is applied to the control gate, the MOS transistor is conductive. If a binary "1" and "0" are respectively assigned to the conductive and nonconductive states of the memory cell, the data can be detected. In this way, data can be stored in the memory cell. When a voltage of, for example, 12.5 V which is sufficiently higher than a normal power source voltage of 5 V is applied to the control gate and drain, electrons are injected into the floating gate. When such a high voltage is applied, impact ionization occurs in the channel region near the drain, thus causing electrons of the hole-electron pairs generated by the impact ionization to be injected into the floating gate. Electrons thus injected into the floating gate are held inside the floating gate unless data erasing operation is effected.

FIG. 1 is a circuit diagram of a conventional semiconductor memory device having the nonvolatile memory elements described above as memory cell. In FIG. 1, WL1 to WLm denote row lines which are connected to receive row selection signals from a row decoder (not shown), and COL1 to COLn denote column selection lines to which column selection signals from a column decoder (not shown) are supplied. Column selection MOS transistors C1 to Cn are driven by supplying the column selection signals to the column selection lines COL1 to COLn. The MOS transistors C1 to Cn are connected at one end to column lines BL1 to BLn, respectively, and at the other end to circuit node A.

Memory cells M11 to Mmn formed of double gate MOS transistors each having a floating gate are provided in respective intersections of the row lines WL1 to WLm and column lines COL1 to COLn. Each of the control gates of MOS transistors M11 to Mmn is connected to a corresponding one of the row lines, each drain is connected to a corresponding one of the column lines, and each source is connected to ground potential terminal VS, for example ground.

A sense amplifier S/A and one end of a data programming MOS transistor P are connected to circuit node A. The other end of the MOS transistor P is connected to programming power source terminal VP, and the gate thereof is connected to receive a data setting signal DIN for permitting data programming operation. The data setting signal DIN is set to a low or high potential level according to the contents of data to be programmed.

A high voltage of, for example, 12.5 V is applied to the terminal VP, when data is written in the memory cells. When data "0" is written in the memory cell M11, for example, in the memory device of FIG. 1, the signal line DIN and a column selection line COL1 are set to a high potential level so that the MOS transistors P and C1 are turned on. Correspondingly, the high level voltage is applied to the column selection line BL1. At the same time, the row line WL1 is selected and set to a high potential level. As a result, impact ionization occurs in the channel region near the drain of the memory cell M11, causing electrons to be injected into the floating gate thereof. Thus, the memory cell M11 is set into the "0", that is, data "0" is programmed into the memory cell M11.

In order to program data "1" into the memory cell M11, the signal DIN is kept at a low potential level so as to keep the MOS transistor P in a nonconductive state. Thus, the column line BL1 is maintained at a low potential level so that the floating gate of the memory cell M11 is kept in the neutral state.

In the semiconductor memory device shown in FIG. 1, stored electrons in the floating gate of the memory cell can be ejected from the floating gate by exposing the memory device to ultraviolet light to the memory device. The floating gate is returned into the neutral state and therefore data can be programmed again.

FIG. 2 schematically shows the entire construction of a memory circuit or a chip including the semiconductor memory array and peripheral circuits thereof. The memory circuit of FIG. 2 includes control circuit 1 for controlling an operating condition of the memory chip. Chip enable signal $\overline{CE}$ and output enable signal $\overline{OE}$ are supplied to the control circuit 1, the chip enable signal $\overline{CE}$ being used to control the operating condition of the memory chip and determine whether or not the memory chip is set in the standby mode, and the output enable signal OE being used to control an output buffer circuit so as to set an output buffer section of the output buffer into a high impedance state. The semiconductor chip is maintained in an active mode, when the chip enabling signal $\overline{CE}$ is kept at "0" level. In contrast, the semiconductor chip is maintained in the standby mode, when the chip enable signal $\overline{CE}$ is kept at "1" level. In the standby mode, a consumption current consumed in the semiconductor chip is decreased to be kept at a power-down condition. In this condition, no data is outputted from the semiconductor chip and an output terminal (the output section) is set to be at the high impedance state. The output terminals are set to be at a high impedance state, even if the output enable signal $\overline{OE}$ is kept at "0" level or "1" level, when the chip enable signal $\overline{CE}$ is kept at "1" level. In the active mode wherein the chip enable signal $\overline{CE}$ is kept at "0" level, data is outputted from the output buffer, when the output enable signal $\overline{OE}$ is set to "0" level. On the other hand, even if the semiconductor chip is maintained in the active mode wherein the chip enable signal $\overline{CE}$ is kept at "0" level, if the output enable signal $\overline{OE}$ which is kept at "1" level causes the output buffer to set to the high impedance state, no data is outputted from the buffer. The control circuit 1 generates $\overline{CE}$ and $\overline{OE}$ control signals in response to the chip enable signal $\overline{CE}$ and the output enable signal $\overline{OE}$. The $\overline{CE}$ and $\overline{OE}$ control signals are used to control the operation of column address buffer 2, row address buffer 3, column decoder 4, row decoder 5 and output buffer 6. As shown in FIG. 1, memory cell array 7 is constituted by the nonvolatile memory cells arranged in the matrix form of the rows and columns, and column gate 8 is constituted by the column selection MOS transistors C1 to Cn.

In the above semiconductor memory device or EPROM, it is possible to erase data by use of ultraviolet rays and reprogram data electrically. However, in general, semiconductor user scarcely so use EPROM as to erase initial data and write new data after the EPROM having the initial data had been used. That is, EPROM is always used such that data programming operation is effected only once. With such a market taken into consideration, semiconductor memory devices packed cheep plastic packages are manufactured instead of expensive ceramic packages each having a window for permitting transmission of ultraviolet rays. Such semiconductor memory device is the same chip as the EPROM but is limited to be programmed only once because the chip is packed in the plastic package which prevents transmission of ultraviolet rays. So, such semiconductor memory devices are so called as one time PROMs (OTP).

In such a one time PROM, if the chip is once packed in the plastic package, data cannot be erased. Therefore it is necessary to ship the semiconductor memory devices with no electrons injected in the floating gate of each memory cell, or with data "1" stored in all the memory cells. For this reason, the programming test of programming data "0" cannot be effected after the packaging and before shipment. Consequently, semiconductor maker cannot test the electrical characteristics such as data readout speed of the devices after the memory chip had been packaged in the plastic package.

SUMMARY OF THE INVENTION

An object of this invention is to provide a semiconductor memory device in which the data readout speed can be precisely measured after the enclosing operation by use of a plastic package and which is high in operation reliability and low in price.

According to this invention, there is provided a semiconductor memory device comprising:

a memory cell array including nonvolatile memory cells;

a plurality of row lines each connected to said memory cells arranged on a corresponding row;

a plurality of column lines each connected to said memory cells arranged on a corresponding column;

address buffer means for receiving external address signals at its address input terminals and for outputting internal address signals;

row and column select means for selecting one of the row lines except at least predetermined one and the column line to select the memory cell in response to internal address signals;

first signal generating means for generating a test mode signals in response to an input control signal;

second select means for controlling the selection of the predetermined row line in accordance with the internal address signals and the test mode signal.

BRIEF DESCRIPTION OF THE DRAWING

FIG. 3 is a block diagram schematically showing a nonvolatile semiconductor memory device according to one embodiment of this invention;

FIG. 4 is a circuit diagram showing an example of a control circuit in a chip enable signal responsive circuit shown in FIG. 3;

FIG. 5 is a circuit diagram showing an example of a control circuit in an output enable signal responsive circuit shown 3;

FIG. 7 is circuit diagram showing an example of a row decoder shown in FIG. 3;

FIG. 9 is a block diagram of the nonvolatile semiconductor memory device according to the second embodiment of this invention in which the memory cell array and dummy cell array are incorporated shown in FIG. 8;

FIG. 10 is a circuit diagram showing an example of a control circuit in a chip enable signal responsive circuit shown in FIG. 9;

FIG. 12 is a block diagram of a circuit for generating a test signal in a nonvolatile semiconductor memory device according to a third embodiment of this invention;

FIG. 13 is a timing chart for showing the timings of signals at various points in the circuit of FIG. 12;

FIG. 14 is a circuit diagram of a row decoder circuit which is driven by means of a test signal generating circuit of FIG. 12;

FIG. 15 is a block diagram schematically showing a nonvolatile semiconductor memory device according to a fourth embodiment of this invention; and FIG. 16 is a circuit diagram schematically showing the memory cell array and dummy cell array shown in FIG. 15.

DETAILED DESCRIPTION OF THE PREFERRED EMBODIMENTS

Figure 1:
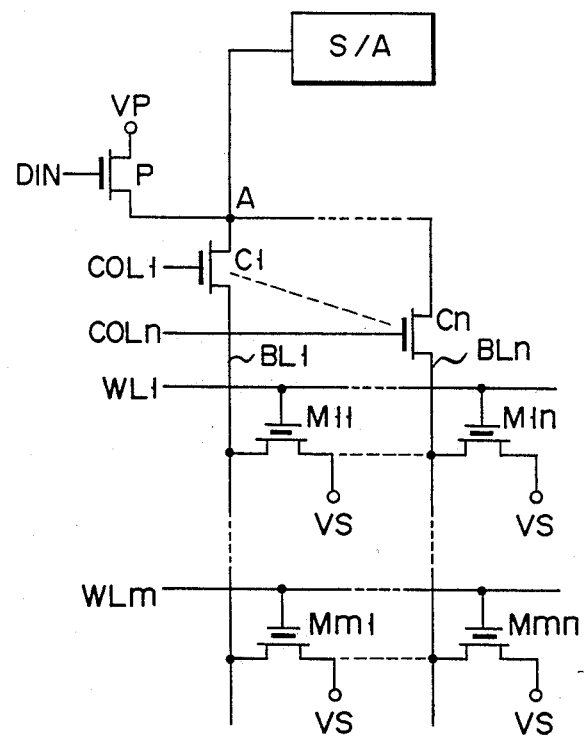
FIG. 1 is a schematic diagram showing the memory array of a conventional semiconductor memory device.
Figure 2:
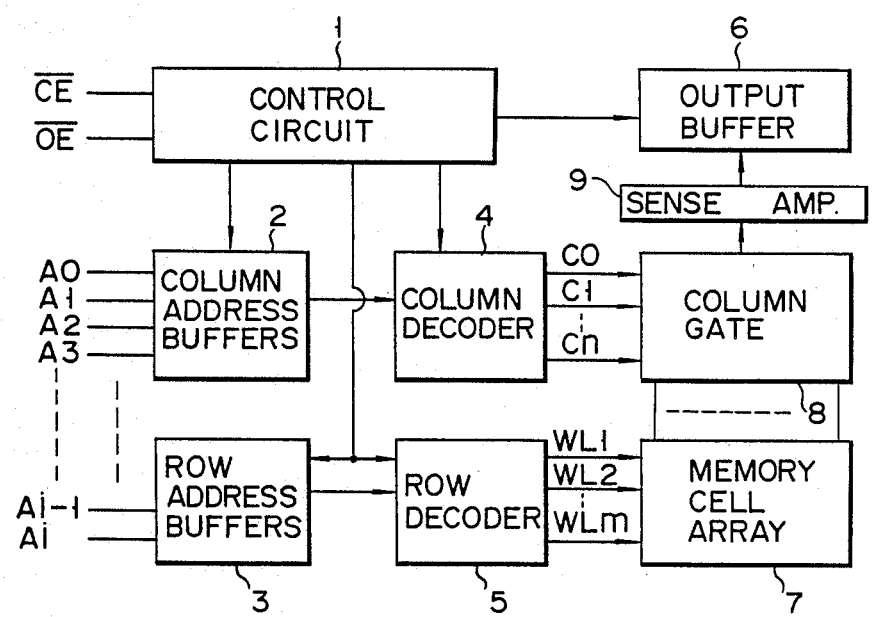
FIG. 2 is a block diagram of a circuit for driving the memory array shown in FIG. 1.

FIG. 3 shows a semiconductor memory device according to one embodiment of this invention. The semiconductor memory device of FIG. 3 includes memory cell array 7 having nonvolatile memory cells set in the data "1" storing state in which no electrons are injected into the floating gate thereof and dummy cell array 10 having dummy cells set in a state corresponding to the data "0" storing state. Further, first row decoder 5 is used to selectively drive the row of memory cell array 7, and second row decoder 11 is used to select the dummy cell array 10 in the test mode. The data readout speed can be measured by selecting the dummy cell array 10 by means of second row decoder 11 in the test mode.

Second row decoder 11 selects the dummy cell array 10, when predetermined address signals $A_{i+1}$, $A_{i+2}$, ..., and $A_j$, for example, the address signals $A_{i+1}$, $A_{i+2}$, ..., and $A_j$ set to "1" level are supplied to row address buffers 3 in the test mode. In contrast, in the normal operation mode, the dummy cell array 10 is not selected, even if the address signals $A_{i+1}, A_{i+2}, \ldots,$ and $A_j$ set to "1" level are supplied to the row address buffers 3. In the normal operation, a row line WLm corresponding to the address signals $A_{i+1}, A_{i+2}, \ldots,$ and $A_j$ is selected and a corresponding memory cell in the memory cell array 7 is selected. The row line selection operations of row decoders 11 in the test mode and normal operation mode are controlled by means of control circuit 12.

The output states of the row address buffers 3 are controlled not only by the address signals $A_{i+1}, A_{i+2}, \ldots,$ and $A_j$ but also by the control circuit 12 and circuit 13.

The control circuit 12 includes additional circuits 12a, 12b and 12c as will be described later. The control circuit 13 also includes additional circuit 13a and 13b as will be described later.

The semiconductor memory device is set to the test mode, when a test mode signal having a high potential level higher that of a normally used logic level "1" is inputted into a chip enabling signal input terminal 123 of the control circuit 12. In the test mode, output signals CEH and $\overline{CEH}$ of the additional circuit 12a are respectively set to "0" and "1" levels. The output signal $\overline{CEH}$ of the additional circuit 12a is supplied to the circuit 12c, the circuit 13b and the row decoder 11. Output signal $\overline{CEH}$ is also supplied to the additional circuit 13a and the row decoder 11.

An output signal $\overline{CE2}$ of the additional circuit 12b is used to control the output state of the row address buffers 3. In the test mode, when the output enable signal $\overline{OE}$ which is inputted to the additional circuit 13a is set at "1" level, the output signal $\overline{CE2}$ of the additional circuit 12b, which is controlled by the additional circuit 13a, is set to "0" level. In this case, the output states of the row address buffers 3 are determined according to the input address, and selection signals corresponding to the input address signals are generated from the row address buffers 3. In contrast, when the output enable signal $\overline{OE}$ is at "0" level, the output signal $\overline{CE2}$ is set to "1" level, and the output states of the row address buffers 3 become equivalent, irrespective of the content of input addresses, to that obtained when the address signals $A_{i+1}, A_{i+2}, \ldots,$ and $A_j$ are set to the predetermined address, for example, the address signals $A_{i+1}, A_{i+2}, \ldots,$ and $A_j$ are set to "1" level. At this time, the row decoder 11 supplies a selection signal to select a dummy row line DWL and, row decoder 5 sets all row lines in unselective condition. In this way, when the semiconductor memory device is set to the test mode, the memory cell array 7 and the dummy cell array 10 are selected depending on "0" level or "1" level of the output enable signal $\overline{OE}$. In this embodiment, data "1" and "0" can be alternately read out in accordance with output enable signal $\overline{OE}$, because data "0" is stored in the dummy cell array 10 and data "1" is stored in memory cell array 7.

Now, each of the blocks shown in FIG. 3 is explained in detail with reference to FIGS. 4 to 8.

FIG. 4 shows the control circuit 12. The additional circuit 12c generates output signal $\overline{CE1}$ in response to the chip enable signal $\overline{CE}$. The additional circuit 12a includes a high voltage detection circuit 122 whose input is connected between a chip enable signal input terminal 123 as shown in FIG. 4. In the normal mode, the high voltage detection circuit 122 receives the chip enable signal $\overline{CE}$ having normal logic level and generates the chip output signals CEH and $\overline{CEH}$ which are set to "1" and "0" levels, respectively. In the test mode, the chip enable signal $\overline{CE}$ having a high level voltage of, for example, 12.5 V which is higher than that of the normal logic level is inputted into the high voltage detection circuit 122 so that the high voltage detection circuit 122 generates output signals CEH and $\overline{CEH}$ which are set to "0" and "1" levels, respectively. The additional circuit 12c includes CMOS inverters and a NAND gate circuit which are constituted by P- and N-channel MOS transistors. In the additional circuit 12C, an inverter 129 is constituted by P-channel MOS transistors 126, 127 and an N-channel MOS transistor 128. The transistors 126, 127 and 128 are connected in series between a power source VC (for example +5 V) and a power source VS (for example ground). The gate of transistor 126 is connected to the power source VS, and the gates of transistors 127, 128 are connected to chip enable signal input terminal 123. An inverter 110 is constituted by a P-channel transistors 131 and an N-channel MOS transistor 132, the gates of transistors 131 and 132 are connected to a connecting point between the transistors 127 and 128. The transistors 131 and 132 are connected in series between the power source VC and the power source VS. A NAND gate circuit 120 is constituted by P-channel transistors 133, 136 and N-channel transistors 134, 135. The gates of transistors 133, 134 are connected to a connecting point between transistors 131 and 132. The gates of transistor 135, 136 are connected to line 124 and are supplied with the signal CEH. The transistors 133, 134 and 135 are connected in series between the power source VC and the power source VS. The transistor 136 is connected between the power source VC and the connecting point of the transistor 133 and the transistor 134. A connecting point between the transistors 133 and the transistor 134 is connected to gates of P- and N-channel transistors 137, 138 constituting an inverter 139. The transistors 137 and 138 are connected in series between the power sources VC and VS. A connecting point between transistors 137, 138 is connected to line 140 and outputs the signal $\overline{CE1}$. The additional circuit 12a detects whether the semiconductor chip is set to the test mode or the normal readout mode. The additional circuit 12a detects "0" level as an input signal, when normally used logic level "0" or "1" is inputted the $\overline{CE}$ terminal 123 of the additional circuit 12a. In contrast, additional circuit 12a detects "1" level as the input signal, when a high voltage, for example, 12.5 V which is higher than that of normally used logic level "1" is inputted as the test mode signal in the $\overline{CE}$ terminal 123 of the additional circuit 12a. The output signals CEH, $\overline{CEH}$ are set to "0" and "1" levels, respectively, when the high voltage of 12.5 V is applied to the $\overline{CE}$ terminal 123 of the additional circuit 12a. The output signal $\overline{CE1}$ is in phase with the chip enable signal $\overline{CE}$ when the chip enable signal $\overline{CE}$ is set at normal logic "0" or "1" level. Further, when the chip enable signal $\overline{CE}$ is set at a high voltage of, for example, 12.5 V, output signal CEH of the additional circuit 12a is set to "0" level so that an output signal of the NAND gate circuit 120 is set at "1" level. Consequently, the chip enable signal CE1 is set at "0" level.

The additional circuit 12b includes a NAND gate circuit. The output signal of the NAND gate circuit 120 and an output $\overline{O}$ of the additional circuit 13a in the control circuit 13 which will be described later are supplied to the NAND gate circuit 120. In the additional circuit 12b, the NAND gate circuit is constituted by P-channel MOS transistors 140 and 141 and N-channel MOS transistors 142 to 143. The transistors 140, 142 and 143 are connected in series between power sources VC and VS. The gates of transistors 140, 142 are connected to the output of the NAND gate circuit 120 and the gates of transistors 141, 143 are connected a line 177 to which the output $\overline{O}$ is applied. A connecting point between transistors 140 and 142 is connected to a line on which signal $\overline{CE2}$ is generated. The transistor 141 is connected between the power source VC and the connecting point of the transistors 140 and 142. In the test mode, the additional circuit 12b outputs the signal $\overline{CE2}$ as the inversion form of input signal $\overline{O}$. The signal $\overline{CE2}$ is inputted into row address buffer 3 as will be described later.

FIG. 5 shows the control circuit 13. In the additional circuit 13b, NOR gate circuit 147 is constituted by P-channel MOS transistors 148, 149 and N-channel MOS transistors 150 and 151. The transistors 148, 149 and 150 are connected in series between power sources VC and VS. The gates of transistors 149, 150 are connected to output an input terminal 152 of the output enable signal $\overline{OE}$ and the gates of transistors 148, 151 is connected to a line 140 to which the signal $\overline{CE1}$ is applied. A connecting point between transistors 149 and 150 is connected to gates of P- and N-channel transistors 153, 154 constituting an inverter 155. The transistors 153 and 154 are connected in series between the power sources VC and VS. The transistor 151 is connected between the power source VS and the connecting point of the transistors 149 and 150. A NAND circuit 130 is also constituted by using P- and N-channel transistors 155 to 158. The transistors 155, 157, 158 are connected in series between power sources VC and VS. The gates of transistors 155, 157 is connected to a connecting point between transistors 153 and 154 and the gates of transistors 156, 158 are connected to line 124 to which the signal CEH is applied. A connecting point between the transistors 155 and 157 is connected to gates of P- and N-channel transistors 159, 160 constituting an inverter 61. The transistor 156 is connected between the power source VC and the connecting point of the transistors 155 and 157. The transistors 159 and 160 are connected in series between the power sources VS and VC. A connecting point between the transistors 159 and the transistor 160 is connected to a line 161 on which signal $\overline{OE1}$ is generated and is connected to gates of transistor 162, 163 constituting an inverter 164. The transistors 162 and 163 are connected in series between the power sources VC and VS. A connecting point between the transistor 162 and the transistor 163 is connected to a line 165 on which a signal $\overline{OE1}$ is generated. In the normal readout operation mode, the signal $\overline{OE1}$ is in phase with the input signal $\overline{OE}$, and the signal OE1 has the inversion form of the input signal $\overline{OE}$. Consequently, if the input signal $\overline{OE}$ is set to level "0", the output signals $\overline{OE1}$ and OE1 are set to levels "0" and "1", respectively. In this levels, data is outputted from output buffer 6. In the test mode, the output signal CEH is set to level "0" as described above. The output signal of the NAND gate circuit 130 is set to level "1" by the "0" level signal CEH. The output signal $\overline{CE1}$ of the inverter 161 to which the output signal of NAND circuit 130 is inputted is set to level "0". Consequently, the output signals OE1 and $\overline{OE1}$ of the control circuit 13b are respectively set at "1" and "0" levels in the test mode. As a result, output buffer 6 is set in the readout operation mode irrespective of the output enable input signal $\overline{OE}$. The output signal $\overline{CE1}$ of the additional circuit 12c is supplied as one input signal to the NOR gate circuit 147 having two input terminals. The NOR gate circuit is provided at an input stage in the additional circuit 13b and output enable signal $\overline{OE}$ is also supplied as the other input signal. In the normal readout operation mode, the output signal $\overline{OE1}$ is in phase with output enable signal $\overline{OE}$, when the signal $\overline{CE1}$ is set to level "0", i.e., the semiconductor memory chip is set in the active mode. Thus, the output buffer 6 is controlled by the output enable signal $\overline{OE}$. On the contrary, when the semiconductor memory chip is set in the standby mode, the signal $\overline{CE1}$ is maintained in level "1" so that output signal $\overline{OE1}$ set to level "1" and output signal OE1 is set to level "0" irrespective of output enable signal $\overline{OE}$. Thus, the output buffer 6 is set in the high impedance state. In the additional circuit 13a, gates of P- and N-channel transistors 166, 167 constituting an inverter 168 is connected to the connecting point between the transistor 149 and the transistor 150. The transistors 166, 167 are connected in series between the power sources VC and VS. The connecting point between transistor 166 and transistor 167 is connected to gates of P- and N-channel transistors 169, 170 constituting an inverter 171. The transistors 166, 167 are connected in series between the power sources VC and VS. A NAND circuit 172 is constituted by using P-channel transistors 173, 174 and N-channel transistors 175, 176. The transistors 173, 175 and 176 are connected in series between the power sources VC and VS. The gates of the transistors 173, 175 are connected to the connecting point between the transistor 169 and the transistor 170, and the gates of the transistors 174, 176 are connected to the line 125 to which the signal $\overline{CEH}$ is applied. A connecting point between the transistors 173 and the transistor 175 is connected to the line 144 on which the signal 0 is generated. The transistor 174 is connected between the power source VC and the connecting point of the transistors 173 and 175.

In the normal operation mode, the output signal $\overline{CEH}$ of the additional circuit 12a is kept at "0" level. Thus, the output signal 0 of the additional circuit 13a is kept at "1" level irrespective of the output enable signal $\overline{OE}$ during a period of the normal readout operation mode. In contrast, since the signal $\overline{CEH}$ is set to "1" level in the test mode, the output signal $\overline{O}$ is generated in response to the output enable signal $\overline{OE}$. This output signal $\overline{O}$ is in phase with the output enable signal $\overline{OE}$. The output signal $\overline{O}$ of the additional circuit 13a is supplied to the additional circuit 12b which is constituted by using the NAND gate circuit in control circuit 12. Therefore the output signal $\overline{CE2}$ of the additional circuit 12b is generated in the inverted form of the output enable signal $\overline{OE}$ in the test mode.

Figure 6:
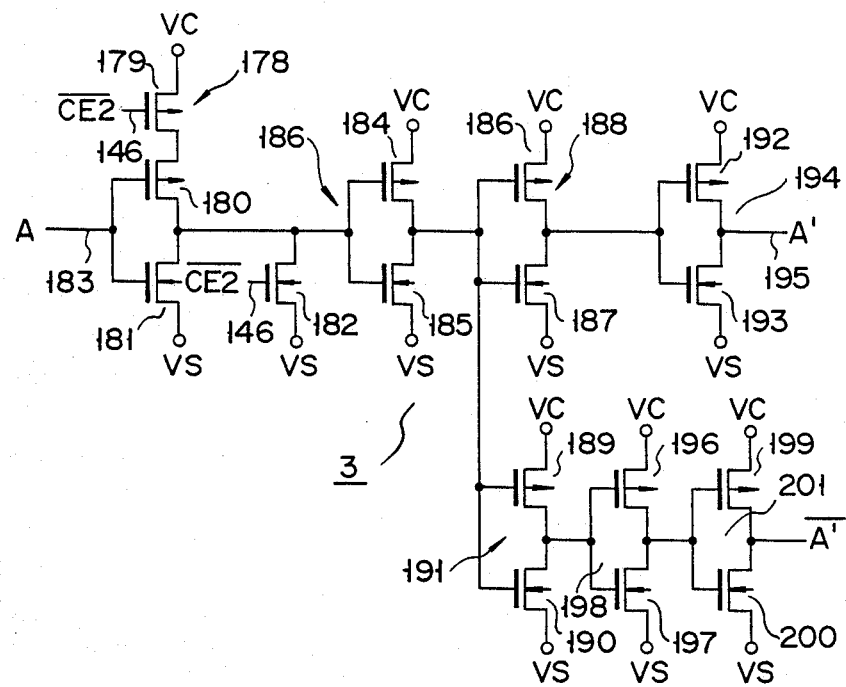
FIG. 6 is a circuit diagram showing an example of a row address shown in FIG. 3.

FIG. 6 shows one of the row address buffers 3. In the row address buffer 3, a NOR gate circuit 178 is constituted by using P-channel MOS transistors 179, 180 and N-channel MOS transistors 181, 182. The transistors 179, 180 and 181 are connected in series between the power sources VC and VS. The gates of the transistors 180, 181 are connected to an address signal input terminal 183 to which an input address signal A is applied. The gates of the transistors 179, 182 are connected to the line 146 to which the signal CE2 is applied. Gates of P- and N-channel transistors 184, 185 constituting an inverter 186 are connected to a connecting point between the transistor 180 and the transistor 181. The transistor 182 is connected between the power source VS and the transistors 180 and 181. The transistors 184 and 185 are connected in series between the power sources VC and VS. Gates of P- and N-channel transistors 186, 187 constituting an inverter 188 are connected to a connecting point between the transistor 184 and the transistor 185 and also connected to gates of P- and N-channel transistors 189, 190 constituting an inverter 191. The transistors 186 and 187 are connected in series between the power sources VC and VS and the transistors 189, 190 are connected in series between the power sources VC and VS. Gates of P- and N-channel transistors 192, 193 constituting an inverter 194 are connected to a connecting point between the transistors 186 and the transistor 188. A connecting point between the transistors 192 and the transistor 193 is an output signal line 195 on which an output signal A' is generated. Gates of P- and N-channel transistors 196, 197 constituting an inverter 198 are connected to a connecting point between the transistors 189 and the transistor 190. The gates of P- and N-channel transistors 199, 200 constituting an inverter 201 are connected to a connecting point between the transistor 196 and the transistor 197. The transistors 196 and 197 are connected in series between the power sources VC and VS and the transistors 199 and 200 are connected in series between the power sources VC and VS. A connecting point between the transistor 199 and the transistor 200 is connected to output signal line 202 on which an output signal $\overline{A'}$ is generated. The signal $\overline{CE2}$ is inputted to the NAND circuit 178, and is in phase with the chip enable signal $\overline{CE}$ in the normal readout operation mode. In the test mode, when output enable signal $\overline{OE}$ is at "1" level, signal $\overline{CE2}$ is set to "0" level. Therefore the output signal A' and $\overline{A'}$ are generated in response to the input address signal A. Further, when the output enable signal $\overline{OE}$ is set at "0" level in the test mode, signal CE2 is set to "1" level. Consequently, the output signals A' and $\overline{A'}$, irrespective of the address signal A, are set to levels "1" and "0", respectively. Output signals of the row address buffer 3 are supplied to the first and second row decoders 5 and 11 shown in FIG. 3.

FIG. 7 shows the row decoder 11. The row decoder 11 selects the memory cell when all the address input signals input $A_{i+1}, A_{i+2}, \ldots,$ and $A_j$ are set at "1" level. In FIG. 7, signals W/R and VHIN are programming control signals and are respectively set at "1" and "0" levels in the normal readout operation mode. The output signals $\overline{CEH}$ and CEH from the additional circuit 12a are supplied to circuits 111 and 112, respectively. In the row decoder 11 shown in FIG. 7, N-channel transistors 210 to 212 are connected in series between the power source VS and a N-channel transistor 213, the N-channel transistor 213 and a N-channel transistor 214 are connected in parallel, and the gates of the transistors 210 to 214 are connected to the outputs of the row address buffers 3. The circuit 111 is constituted by using P-channel transistors 215 to 217 and N-channel transistors 218, 219. The transistors 216, 217 and 218 are connected in series between the power source VS and power source VC. The gate of transistor 215 is connected to the line 125 to which the signal $\overline{CEH}$ is applied, and the transistor 215 is connected between the transistor 213 and the gates of transistors 217, 218. The transistors 216 to 219 constitutes a NOR gate circuit 220. The gates of the transistors 215, 216 and 219 are connected to the line 125 to which the signal $\overline{CEH}$ is applied. The connecting point between the transistor 217 and the transistor 218 is connected to one end of a depletion type MOS transistor 221. The transistor 219 is connected between the power source VS and the connecting point of transistors 217, 218. The other end of the transistor 221 is connected to the row line WLm. A N-channel enhancement type MOS transistor 222 and a N-channel depletion type MOS transistor 223 are connected in series between the power source VP and the row line WLm. The gate of the transistor 223 is connected to the row line WLm. The signal VHIN is applied to the gate of the transistor 222. Circuit 112 which is constructed by using P-channel transistors 224 to 226 and P-channel transistors 227 and 228 has the same transistor arrangement as that of the circuit 111. The transistors 225, 226 and 227 are connected is series between the power source VC and power source VS. The transistor 224 is connected between the power source VC and the gates of transistors 226 and 227. However, the gates of transistors 224, 225 and 228 are connected to the line 124 to which the signal CEH is applied. The transistor 228 is connected between the power source VS and the connecting point of the transistors 226 and 228. Depletion type transistor 229 is also connected between the dummy row line DWL and the NAND circuit 230. In the normal readout operation mode, the signals $\overline{CEH}$ and CEH are respectively set at "0" and "1" levels, thus setting circuits 111 and 112 into operative and non-operative conditions, respectively. Therefore when all the input address signals of the row address buffers 3 are set to "1" level in the normal readout operation mode, the row decoder 11 selects the row line WLm of the memory cell array 7.

In the test mode, the signal CEH is a "1" level, thus enabling the circuit 112. Therefore when the output signal $\overline{OE}$ is at "0" level, the dummy row line DWL of the dummy cell array 10 is selected irrespective of the input address signals of the row address buffer 3.

Figure 8:
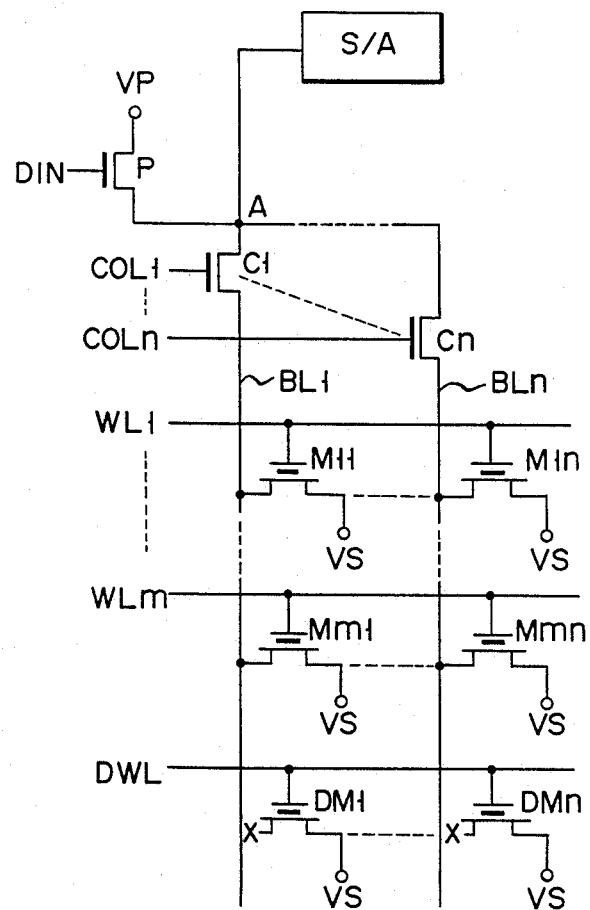
FIG. 8 is a circuit diagram schematically showing the memory cell array and dummy cell array of a nonvolatile semiconductor memory device according to a second embodiment of this invention.

FIG. 8 shows memory the cell array 7 including the nonvolatile memory cells M11 to Mmn and the dummy cell array 10 including dummy cells DM1 to DMn which are set to a memory state equivalent to the data "0" storing state. In the circuit of FIG. 8, the drains of the double gate transistors acting as the dummy cells disconnect from respective column lines BL1 to BLn (as shown by mark X in FIG. 8), and hence the dummy cells are equivalently set to the nonconductive state, thus making it possible to read out data "0". It is also possible to disconnect the sources of the double gate transistors acting as the dummy cells from the power source VS that the dummy cells are equivalently set to the nonconductive state. Thus, it is possible to read out data "0".

In an ordinary semiconductor memory device, a reference potential is generated by use of second dummy cells connected to a dummy column line, and the logic level of the readout data is determined by comparing the reference potential and a potential of the column line to which a memory cell of the main memory cell array is connected. The gates of the second dummy cells (not shown) are connected to the row lines WL1~WLm and the dummy row line DWL, respectively, the drains of the second dummy cells are connected to the dummy column line and the sources of the second dummy cells are connected to power source VS. The second dummy cell is identical to the memory cell. The second dummy cells are arranged adjacent to the memory cell array 7. The floating gate of the second dummy cells are not charged. In the normal readout operation mode, one of the row lines WL1~WLm is selected and data is read out from the memory cells connected to the selected one. At this time, the second dummy cell connected to the selected row line is also selected to generate the reference potential. The reference potential is between the potential swing that occurs the column line. That is, a binary "0" or "1" of data stored in the memory cell is determined in accordance with whether the potential of the column line is higher or lower than the potential of the dummy column line as the reference potential. The potential of the column line is changed depending on the row line selection or row line unselection. The second dummy cell is affected by the row line selection or unselection. That is, some second dummy cell is changed from the off state to the on state and the other second dummy cell is changed from the on state to the off state in accordance with the row line selection or unselection. The potential of the dummy column line is temporarily varied during a transition period of changing between the on and off states of the dummy second cells. In the test mode, too, it is preferable that the potential of the dummy column line is temporarily varied in accordance with the dummy row line DWL selection or unselection. Because a data readout speed in the test mode is substantially equal to a data read out speed in the normal readout operation mode, if the change of the dummy column line potential in the test mode is equal to that of the dummy column line potential in the normal readout mode. In this case, it is very important to connect the dummy row line DWL to the gate of the dummy cell as shown in FIG. 8. This is because the above connection permits a capacitance associated with dummy row line DWL to be equal to that of each of row lines WL1 to WLm, and consequently the changing speed of the potential of the row line can be made equal to that of the potential of the dummy row line.

In the above embodiment, it is explained that the memory cell array 7 and the dummy cell array 10 are selected respectively when the output enable signal $\overline{OE}$ is set at "1" and "0" levels in the test mode. However, it is possible to select the dummy cell array 10 by setting all the input address signals of the row address buffers 3 to "1" level even when the output enable signal $\overline{OE}$ is set at "1" level.

In other words, all the input address signals of the row address buffers 3 are first set to "1" level in the test mode to select the dummy row line DWL, and then the input address signals of the row address buffers 3 is changed to a desired address specifying a memory cell to be selected. In this way, if the operation of setting all the input address signals to "1" level and changing the input address to a desired address specifying a memory cell to be selected is repeatedly effected, data "0" and "1" are alternately read out. Thus, it becomes possible to measure the electrical characteristics or data readout speed of a desired memory cell. Furthermore, with this method, the input address signals are actually changed, and therefore, it becomes possible that the data readout speed in the test mode is perfectly equal to the data readout speed in the normal readout mode.

In the embodiment shown in FIG. 8, the dummy cells DM1..., DMn are not connected to the row lines BL1, ..., BLn. However, the dummy cells DM1,.., DMn may be connected to the row lines BL1, ..., BLn, if electrons are injected into the floating gates of the dummy cells DM1, ..., DMn. That is, the drain of each dummy cells DM1, ..., DMn may be connected to the column lines BL1,.., BLn and the source of each dummy cells DM1, ..., DMn may be connected to the power source VS. Furthermore, a depletion type transistor and enhancement transistor having a gate to which the signal VHN is applied may be connected between the dummy row line DWL and the power source VP in row decoder 11 shown in FIG. 7 to have a same arrangement as that between the row line WLm and the power source VP. In this arrangement, a high voltage can be applied to the dummy line DWL from power source VP so that data can be written into the dummy cells DM1, ..., DMn, i.e., electrons can be injected into the floating gates of the dummy cells when the dummy cells DM1, ..., DMn are selected. In this modification, data "0" can be read out in a same manner as that of the embodiment shown in FIG. 8, when the dummy cell is selected. In this modified semiconductor memory chip, the data readout speed can be more precisely measured in the test mode, because the dummy memory cells have a same condition as that of the memory cell to which user will write data, i.e., electrons are injected to the floating gates of the dummy cells in a same manner as that of the memory cell to which the user will inject electrons.

FIG. 9 shows a semiconductor memory device according to a second embodiment of this invention. The semiconductor memory device includes dummy cell array 10 having dummy cells set in a state equivalent to the data "0" storing state in a same manner as that of the first embodiment. A period from the time that the address is changed to the time at which data is outputted can be measured as in the case of the first embodiment by selecting dummy row line DWL connected to dummy cell array 10 in the test mode. In the embodiment of FIG. 9, control circuits 14 and 15 are used instead of control circuits 12 and 13 shown in FIG. 3, and it is also possible to measure a period between the time that the chip enable signal $\overline{CE}$ is changed from level "1" to level "0" and the time at which data is outputted. That is, it is possible to measure the period from the time of the active condition changed from the standby condition to the time at which data is outputted.

In the test mode, the chip enable signal $\overline{CE}$ used as an input signal of the control circuit 14 is set at a high voltage level, for example, 12.5 V, and output voltage CEH and $\overline{CEH}$ from additional circuit 14a which is operated in a same manner as that of the additional circuit 12a are respectively set at "0" and "1" level. Row decoder 11 selects dummy row line DWL when predetermined address signals are inputted into row address buffers, for example, the address signal having "1" levels are inputted into the row address buffers.

In a case where output enable signal $\overline{OE}$ is set at "0" level in the test mode, output signal $\overline{O}$ of additional circuit 15a in the control circuit 15 is set in "0" level, signal $\overline{CE1}$ which is outputted from additional circuit 14d is set to "0" level in response to the signal O. The state in which the signal $\overline{CE1}$ is level "0" is equal to a state in which the chip enable signal $\overline{CE}$ having level "0" is inputted in the chip enable terminal. The readout operation mode is set when the signal $\overline{CE}$ is level "0", so the readout operation mode is set when signal $\overline{CE1}$ is level "0". In this case, when all the address signal $A_{i+1}$, $A_{i+2}$, ..., and $A_j$ are set to "1" level, the dummy row line DWL can be selected, making it possible to measure the period from the time that the address has been changed to the time at which data "0" is outputted.

Data "1" is read out, when at least one of the address signals $A_{i+1}, A_{i+2}, \ldots,$ and $A_j$ is level "0".

When the output enable signal $\overline{OE}$ is set to "1" level, the output signal $\overline{O}$ of the additional circuit 15a is set to "1" level. So the signal $\overline{CE1}$ is set to "1" level in response to the signal $\overline{CE}$ which is set to the high level, for example, 12.5 V, thus this semiconductor device is set to the standby mode. However, at this time, the signal CEH which is set to "0" level is supplied to additional circuit 14b. So the output signal $\overline{CE2}$ from the additional circuit 14b is set to "0" level. The signal $\overline{CE2}$ is supplied to the control circuit 15, and the circuit 15 is kept in the active condition.

As described above, when the output enable signal $\overline{OE}$ is set at "0" level, the output signal $\overline{CE1}$ from the additional circuit 14d is set to "0" level, setting the readout mode. In this case, if all the input address signals of the row address buffers 3 are set to "1" level, the dummy row line DWL of the dummy cell array 10 is selected. If at least one address signal of the input address signals is set to "0" level, the row lines WL1 to WLm-1 can be selected. Further, when the output enable signal $\overline{OE}$ is set at "1" level, the signal $\overline{CE1}$ is embodiment, it is determined by the output enable signal $\overline{OE}$, whether the semiconductor memory chip is in the active condition or the standby condition in the test mode. The test mode readout period from the time at which the signal $\overline{OE}$ is set to level "0" to the time at which data is read out is equal to the normal readout period from the time at which the chip is set to the active condition to the time at which data is read out. That is, a period which is substantially equal to access time from the time the signal $\overline{CE}$ has been changed to "0" level, is measured by changing the signal $\overline{OE}$ in the test mode.

Now, each block shown in FIG. 9 is explained more in detail.

FIG. 10 shows the control circuit 14. Additional circuit 14a includes a high voltage detecting circuit as in the additional circuit 12a shown in FIG. 4. The circuit 14c has a same arrangement as the first and second input stages of the circuit 12c. In circuit 14b, P-channel transistors 240, 243 and N-channel transistors 241, 242 constitute NAND gate circuit 244, and P- and N-channel transistors 245, 246 constitutes inverter 247. The gates of the transistors 241, 243 are connected to line 124 to which the signal CEH is applied. Circuit 14d has a same arrangement as that of the circuit 14b. However, in circuit 14d, the gates of the transistor 241, 243 are connected to line 177 to which the signal $\overline{O}$ is applied. When the chip enable signal $\overline{CE}$ is set to a high voltage level of, for example, 12.5 V, the signal CEH is set to "0" level and the signal $\overline{CE2}$ the additional circuit 14b is set to "0" level in response to the signal CEH. The output signal $\overline{O}$ from the additional circuit 15a which will be described later is supplied to the NAND gate circuit 244 in the additional circuit 14d.

When the signal $\overline{O}$ is set at "1" level, the signal $\overline{CE1}$ is changed in response to the signal $\overline{CE}$. In this case, the signal $\overline{CE}$ is 12.5 V so that the signal $\overline{CE1}$ is set to "1" levels.

When the signal $\overline{O}$ is set at "0" level, the signal $\overline{CE1}$ is set to "0" level.

Figure 11:
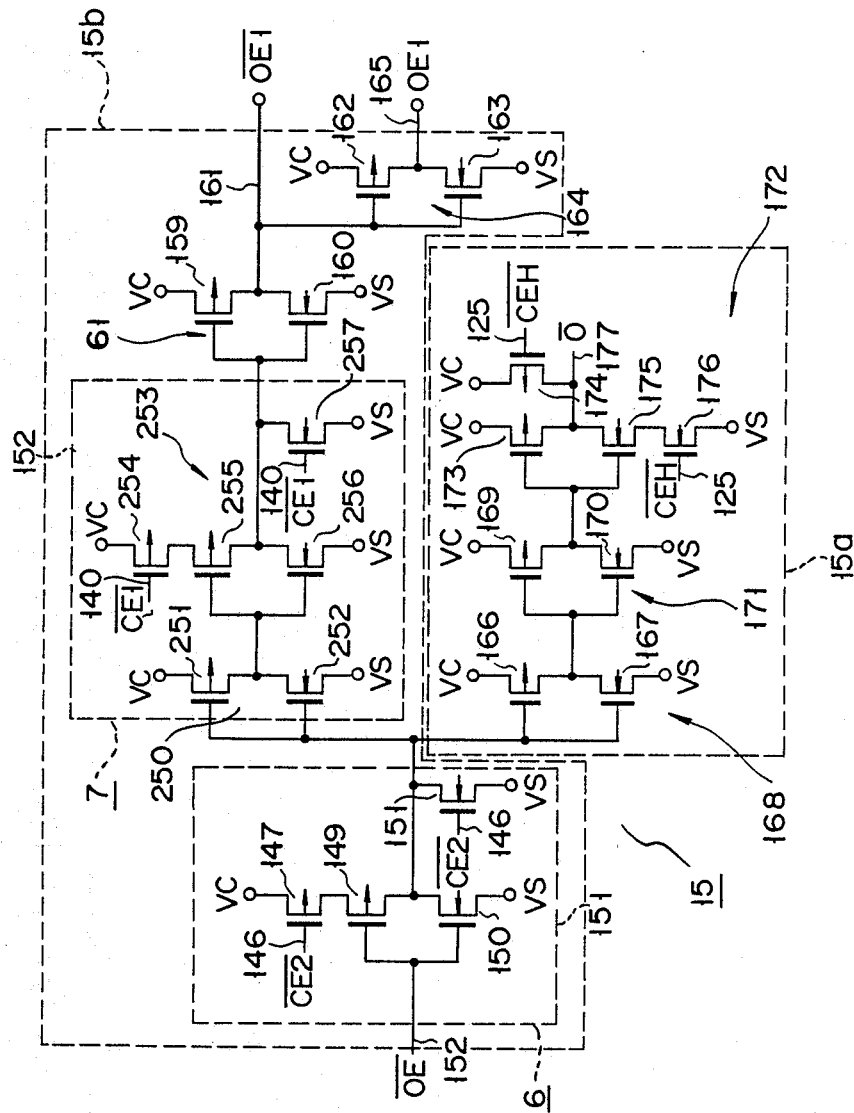
FIG. 11 circuit diagram showing an example of a control circuit in an output enable signal responsive circuit shown in FIG. 9.

FIG. 11 shows the control circuit 15. Circuit 151 in the circuit 15b has a same arrangement as that of the first stage of the circuit 13b and is constituted by a NOR gate circuit to which the output enable signal $\overline{OE}$ and the signal $\overline{CE2}$ are supplied. In circuit 152 of the circuit 15b, inverter 250 connected to the NOR circuit 151 is constituted by using P- and N-channel transistors 251, 252 and NOR gate circuit 253 connected to the inverter 250 is constituted by using P-channel transistors 254, 255 and N-channel transistor 256, 257. The gates of the transistors 254, 257 are connected to the line 140 to which the signal $\overline{CE1}$ is applied. Circuit 15a and the other circuit arrangement shown in FIG. 11 has a same arrangement so that of circuit 13 shown in FIG. 5. In the test mode, the signal $\overline{CE2}$ is set at "0" level, and logic level of the output enable signal $\overline{OE}$ is inverted by the circuit 151 and the inverted output is supplied to the succeeding stage from the circuit 151. The output stage of the additional circuit 15a constitutes a NAND gate circuit to which the signal $\overline{CEH}$ is supplied. In the normal operation mode, signal $\overline{CEH}$ is set at "0" level, and the output signal $\overline{O}$ of the additional circuit 15a is set at "1" level. In contrast, in the test mode, since the signal $\overline{CEH}$ is set at "1" level, the output signal $\overline{O}$ has the same logic level as the signal $\overline{OE}$.

Row address buffers 3 in FIG. 9 may be formed to have the same construction as the row address buffers used in the first embodiment shown in FIG. 6, but the signal $\overline{CE1}$ is used instead of the signal $\overline{CE2}$ as a control signal. Further, row decoder 11 of the construction shown in FIG. 5 can be used without any modification.

With semiconductor memory device described above, in the test mode, the readout mode (active mode) can be set by setting the output enable signal $\overline{OE}$ to "0" level and the standby can be set by setting the output enable signal $\overline{OE}$ to "1" level. Therefore it becomes possible to measure access time from the starting of address change and that from the starting of the $\overline{CE}$ signal change.

The ordinary semiconductor memory device includes two control signal input terminals, that is, signal input terminal $\overline{CE}$ for selectively setting the chip to the active mode or standby mode and signal input terminal $\overline{OE}$ for setting the output buffer section or output terminal into a high impedance condition. In this invention, the two control signal input terminals are effectively used.

In this example, the test mode is set by setting the signal $\overline{CE}$ to a voltage level higher than the normal logic level "1". However, it is also possible to measure the access time by changing the signal $\overline{CE}$ in the test mode which is attained when the signal $\overline{OE}$ is set to a voltage level higher than the normal logic "1" level. As a result of this, the readout time from the starting of change in the signal $\overline{CE}$ can be measured exactly.

There will now be described a third embodiment with reference to FIGS. 12 to 14 in which the test mode is latched and the access time in the normal operation mode can be measured.

FIG. 12 is a block diagram of a circuit for supplying latched test signals T and $\overline{T}$. Test signals T and $\overline{T}$ which are output signals of latch circuit 21 are set at "1" and "0" levels respectively in the normal operation mode. At this time, output signal $\overline{CEH}$ of high voltage detection circuit 20 is set at "0" level. In the test mode, chip enable signal $\overline{CE}$ is set to a high voltage level (for example 12.5 V), causing the output signal $\overline{CEH}$ of high voltage detection circuit 20 to be set to "1" level. As a result, the latch circuit 21 latches data. In this case, address input signal Ai which is the latch data is latched by the latch circuit. The input signal Ai is set to "1" level, the output signals T of the latch circuit is set to "0" level to set the test mode by latching the input signal Ai of "1" level. Next, when the signal $\overline{CE}$ is lowered from the high voltage level to power source voltage level VC or VS, the output signal $\overline{CEH}$ becomes "0" level and the signal Ai is stored in the latch circuit 21 to latch or maintain the test mode. If the test mode is kept latched, it becomes unnecessary that the specified pin is kept at a high voltage during the test mode. Thus, all the pins can be freely used as in the normal readout mode, and the access time can be measured in substantially the same condition as the normal operating condition. In order to reset or release the test mode, the signal $\overline{CE}$ is set to the high voltage level and the input signal Ai is set to "0" level. FIG. 13 is a timing chart for explaining the operation of the circuit.

In a case where the test mode latching circuit as described above is used, row decoder 11 is formed to have the construction as shown in FIG. 14. Row decoder 11 has a substantially same arrangement as that of FIG. 7. However, the gates of the transistors 215, 216, 219, are connected to the test mode line 261 on which the test mode signals $\overline{T}$ is applied. The gate of the transistors 224, 225 and 228 are connected to the line 260 on which the test mode signal T is applied. That is, the row decoder 11 is constituted to select the row line WLm or the dummy row line DWL according to latched test mode signals T and $\overline{T}$.

FIG. 15 shows a fourth embodiment of this invention. The semiconductor memory device shown in FIG. 15 has a substantially same arrangement as that of FIG. 9. The block diagram shown in FIG. 15 includes two additional row decoders 11a and 11b and dummy cell array 10 is formed into a matrix form in different with the circuit arrangement shown in FIG. 9. The block diagram of FIG. 15 also includes a plurality of dummy row lines DWLm−k to DWLm to which dummy cells are connected and column lines to which the drains of the double gate type MOS transistors serving as the dummy cells are respectively connected as shown in FIG. 16. The dummy cell array includes a plurality of dummy cells Dm−k,l, . . . , and DMm,m which are arranged in a matrix form and can be programmed in a same manner as that of the main memory cells M11~Mmn. Each gate of the dummy cells Dm−k,l, . . . , and Dm,m is connected to corresponding one of the dummy row lines DMLm−k, . . . , and DWLm and each drain and source of the dummy cells Dm−k,l, . . . , and Dm,m are connected to corresponding one of the column lines C1, . . . , and Cn and power source VS, respectively. The dummy cell array 10 can be programmed in a desired data. In this way, since programmable dummy cell array 10 is provided, it becomes possible to selectively read out data "1" or "0" from memory cells of the dummy cell array 10.

In FIG. 15, the row decoder 11a selectively activates the row lines WLm−k to WLm according to the address input in the normal operation mode, and the row decoder 11b selectively activates the dummy row lines DWLm−k to DWLm in the test mode according to the same addresses as those for specifying the row lines WLm−k to WLm. With this construction, the readout speed can be measured by reading out data from the dummy cell array 10 without writing data into the memory cell array 7. Further, since desired data can be freely programmed into the dummy cell array 10, the readout speed after the starting of change in the address and that after the starting of change in the signal $\overline{CE}$ can be measured in substantially the same condition as the normal readout condition of the memory cell array 7.

As described above, according to this invention, there is provided a semiconductor memory device in which the readout speed can be measured without writing data. Therefore, even if the semiconductor memory device is packed in a plastic package and used as a one time PROM, the memory characteristics can be measured before the shipment, thus enhancing the reliability and lowering the price thereof.

What is claimed is:

1. A semiconductor memory device comprising:
   a memory cell array having nonvolatile memory cells;
   at least one test cell array having test memory cells;
   a plurality of row lines each being connected to respective memory cells arranged thereon;
   at least one test row line being connected to said at least one test cell array;
   a plurality of column lines each being connected to respective memory cells arranged thereon;
   address buffer means for receiving address signals and providing respective internal address signals in an active mode;
   means for selecting one of said plurality of row lines other than a predetermined one of the row lines and means for selecting one of said plurality of column lines, to designate one of the memory cells in response to the internal address signal provided from the address buffer means;
   output buffer means for storing data provided from the memory cell whenever the memory cell is in the active mode;
   first means for providing a test mode signal, a first control signal, and a chip enable signal, said chip enabling signal causing said address buffer means to be in the active mode based on the level of a first input control signal provided to the input of said first signal providing means;
   second means for providing a second control signal which causes said first signal providing means to provide said chip enable signal in response to said first control signal and a second input control signal provided to the input of said second signal providing means, and for providing an output enable signal to cause said output buffer means to be in the active mode based on the second input control signal, said chip enable signal causing said second signal providing means to change from the active mode to a different mode in response; and
   means for selecting said predetermined row line and at least one test row line in accordance with the internal address signals provided from said address buffer means and the test mode signal provided from said first signal providing means.

2. A semiconductor memory device according to claim 1, wherein each one of said test memory cells has a source, a drain, and a control gate, said control gate being connected to said at least one test row line.

3. A semiconductor memory device according to claim 2, further comprising at least one power source line, wherein one of the drain and source is connected to a respective one of the column lines and the other of the drain and source is connected to said at least one power source line.

4. A semiconductor memory device according to claim 2, further comprising at least one power source line, wherein one of the drain and source is connected to said at least one power source line and the other of the drain and source is connected to a respective one of the column lines.

5. A semiconductor memory device according to claim 1, further comprising means for providing a signal for activating said output buffer means in response to one of the test mode signal and said second input control signal.

6. A semiconductor memory device according to claim 5, wherein said address buffer means includes row address buffer means for receiving address signals and providing respective address signals to said row line selecting means and said predetermined row line selecting means; and 7. A semiconductor memory device according to claim 6, wherein said second signal providing means includes a circuit which produces a switching signal in response to the second input control signal whenever said second signal providing means receives the test mode signal.

8. A semiconductor memory device according to claim 7, wherein said first signal providing means includes means for providing a buffer control signal in response to the second input control signal and the switching signal, to control said row address buffer means and said row address buffer means produces predetermined address signals and selectively provides one of the address signals provided to the input of the address buffer means and the predetermined address signal in accordance with the buffer control signal.

9. A semiconductor memory device according to claim 8, wherein the buffer control signal is inverted from the second input control signal and said row address buffer means provides the predetermined address signals when the buffer control signal has a normal logic level and said address buffer means provides the address signals provided to the input of the address buffer means when the buffer control signal has a level different from the normal logic level.

10. A semiconductor memory device according to claim 7, wherein said first signal providing means includes means for providing the chip enable signal in response to the first input control signal having a normal logic level, wherein the logic level of the chip enable signal is provided in accordance with the switching signal.

11. A semiconductor memory device according to claim 10, wherein said first signal providing means includes a NOR gate circuit and said switching signal providing circuit includes first means for inverting the output of the NOR gate circuit, second means for inverting the output of the first inverting means and the NAND gate circuit whereby the first input control signal and the output of the second inverting means are provided thereto.

12. A semiconductor memory device according to claim 7, wherein said first signal providing means includes means for providing said chip enable signal in response to the first input control signal being in phase therewith and having a normal logic level.

13. A semiconductor memory device according to claim 1, wherein said first signal providing means includes a high voltage detection circuit which provides the test mode signal, said test mode signal having a normal logic level when the first input control signal has a predetermined high level higher than the normal logic level and said first signal providing means provides a normal mode signal having a logic level different from that of the test mode signal when the first input control signal has the normal logic levels.

14. A semiconductor memory device according to claim 13, wherein said first signal providing means includes means for converting the first input control signal having the predetermined high level into a chip control signal having the predetermined high level and the normal mode signal into the chip control signal having the normal logic level and being in phase with the first input control signal.

15. A semiconductor memory device according to claim 14, wherein said first signal providing means includes a NAND gate circuit whereby the first input control signal and the test mode signal are provided thereto and means for inverting the output of the NAND gate circuit, to provide the chip enable signal.

16. A semiconductor memory device according to claim 15, wherein said first signal providing means provides the chip enable signal in response to the first control signal, and said second signal providing means includes a NOR gate circuit whereby the chip enable signal and the second input control signal are provided thereto, first means for inverting the output of the NOR gate circuit, a NAND gate circuit whereby the output of the first inverting means and the first input control signal are provided thereto, second means for inverting the output of the NAND gate circuit and third means for inverting the output of the second inverting means, whereby the activating signal is provided from the second and third inverting means.

17. A semiconductor memory device according to claim 16, wherein said chip enable signal effects said second signal providing means.

18. A semiconductor memory device according to claim 16, wherein said address buffer means includes column address buffer means for providing address signals to said column line selecting means, said column address buffer means being effected by the chip enable signal.

19. A semiconductor memory device according to claim 16, wherein said row address buffer means provides predetermined address signals and provides at least one of the address signals provided to the input of said address buffer means and said predetermined address signals in accordance with the chip enable signal.

20. A semiconductor memory device according to claim 19, wherein said latching means is deenergized when the first input control signal having the predetermined high level is provided thereto.

21. A semiconductor memory device according to claim 13, wherein said first signal providing means includes means for latching the test mode signal when the first input control signal has the predetermined high level.

22. A semiconductor memory device according to claim 1, wherein said test memory cells includes nonvolatile memory cells.

23. A semiconductor memory device according to claim 22, further comprising means for programming said test memory cells.

24. A semiconductor memory device according to claim 1, said at least one test row line includes more than one test row line.

25. A semiconductor memory device comprising:
 a memory cell array including nonvolatile memory cells;

a plurality of row lines, each row line being connected to respective memory cells arranged thereon;

a plurality of column lines, each column line being connected to respective memory cells arranged thereon;

address buffer means for receiving address signals and providing respective internal address signals;

means for selecting one of said plurality of row lines other than at least one predetermined row line and means for selecting one of said plurality of column lines to designate one of the memory cells in response to the address signals provided from the address buffer means;

means for providing a test mode signal in response to an input control signal provided to the input of said test mode signal providing means; and means for selecting said at least one predetermined row line in accordance with the internal address signals provided from the address buffer means and the test mode signals provided from said test mode signal providing means, wherein said test mode signal providing means includes a high voltage detection circuit which produces said test mode signal having a normal logic level whenever said input control signal has a predetermined high level higher than the normal logic level and means for providing a normal mode signal having logic levels different from those of the test mode signal whenever the input control signal has the normal logic level, wherein said test mode signal providing means includes means for converting said input control signal into a chip control signal having the predetermined high level whenever the input control signal has the predetermined high level and converting said normal mode signal into a chip control signal having the normal logic level and being in phase with the input control signal whenever the input control signal has the normal logic level, and wherein said test mode signal providing means includes a NAND gate circuit whereby the input control signal and the test mode signal are provided thereto and means for inventing the output of the NAND gate circuit to provide a chip enable signal.

26. A semiconductor memory device comprising:

a memory cell array including nonvolatile memory cells;

a plurality of row lines, each row line being connected to respective memory cells arranged thereon;

a plurality of column lines, each column line being connected to respective memory cells arranged thereon;

address buffer means for receiving address signals and providing respective internal address signals;

means for selecting one of said plurality of row lines other than at least one predetermined row line, and means for selecting one of said plurality of column lines, to designate a memory cell in response to the internal address signals provided from the address buffer means;

means for providing a test mode signal in response to a first input control signal provided to the input of said test mode signal providing means;

means for selecting said at lease one predetermined row line in accordance with the internal address signals provided from the address buffer means and the test mode signals provided from the test mode signal providing means;

output buffer means for providing data provided from the memory cell;

means for providing an activating signal for effecting said output buffer means in response to a chip control signal and a second input signal, said second input control signal being provided to the input of said activating signal providing means;

wherein said test mode signal providing means includes a high voltage detection circuit which produces the test mode signal having a normal logic level when said first input control signal has a predetermined high level higher than the normal logic level and means for providing a normal mode signal having a logic level different than that of the test mode signal when said fist input control signal has the normal logic level, wherein said test mode signal providing means includes means for converting the first input control signal into said chip control signal having the predetermined high level whenever the first input control signal has the predetermined high level and means for converting said normal mode signal into said chip control signal having the normal logic level and being in phase with the first input control signal whenever the first input control signal has the normal logic level, and wherein said test mode signal providing means provides said chip enable signal in response to the first input control signal, and said activating signal providing means includes a NOR gate circuit whereby the chip enable signal and the second input control signal are provided thereto, first means for inverting the output of said NOR gate circuit, a NAND gate circuit whereby the output of said first inverting means and the first input control signal are provided thereto, second means for inverting the output of said NAND gate circuit, and third means for inverting the output of the second inverting means, whereby said activating signal is provided from the second and third inverting means.

27. A semiconductor memory device according to claim 26, wherein the chip enable signal effects said activating signal providing means.

28. A semiconductor memory device according to claim 26, further comprising column address buffer means for providing address signals to the column line selecting means in response to the chip enable signal.

29. A semiconductor memory device according to claim 26, wherein said address buffer means selectively provides either predetermined address signals or the address signals provided to the input of said address buffer means in accordance with the chip enable signal.

30. A semiconductor memory device according to claim 29, wherein said first signal providing means includes means for latching the test mode signal, said latching means being engaged whenever the first input control signal has a predetermined high level, and disengaged whenever first input control signal has signal levels different from the predetermined high level.

31. A semiconductor memory device comprising:

a memory cell array including nonvolatile memory cells;

a plurality of row lines, each row line being connected to respective memory cells arranged thereon;

a plurality of column lines, each column line being connected to respective memory cells arranged thereon;

address buffer means for receiving address signals and providing respective internal address signals;

means for selecting one of said plurality of row lines other than at least one predetermined row line, and means for selecting one of said plurality of column lines to designate a memory cell in response to the internal address signals provided from the address buffer means;

means for providing a test mode signal in response to a first input control signal provided to the input of said test mode signal providing means;

means for selecting said at least one predetermined row line in accordance with the internal address signals provided from the address buffer means and the test mode signals provided from the test mode signal providing means;

output buffer means for providing data provided from the memory cells;

means for providing an activating signal for effecting said output buffer means in response to one of said test mode signal and a second input control signal, said second input control signal being provided to the input of said activating signal providing means; and row address buffer means for receiving address signals and providing respective address signals to said row line selecting means and said at least one predetermined row line selecting means, wherein said activating signal providing means includes a circuit which produces a switching signal in response to said second input control signal whenever said activating signal providing means receives the test mode signal, and wherein said test mode signal providing means includes means for generating a chip enable signal whenever the first input control signal has a normal logic level, the logic level of the chip enable signal being switched in accordance with the switching signal provided from the activating signal providing means, and wherein said first signal providing means includes a NOR gate circuit, and said switching signal producing circuit includes first means for inverting the output of the NOR gate circuit, second means for inverting the output of the first inverting means and a NAND gate circuit whereby the first input control signal and a signal from the output of the second inverting means are provided thereto.

* * * * *